United States Patent
Pei et al.

(10) Patent No.: US 9,818,652 B1
(45) Date of Patent: Nov. 14, 2017

(54) COMMONLY-BODIED FIELD-EFFECT TRANSISTORS

(71) Applicant: GLOBALFOUNDRIES INC., Grand Cayman (KY)

(72) Inventors: Chengwen Pei, Danbury, CT (US); Ping-Chuan Wang, Hopewell Junction, NY (US); Kai D. Feng, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/140,025

(22) Filed: Apr. 27, 2016

(51) Int. Cl.
*H01L 27/12* (2006.01)
*H01L 21/84* (2006.01)
*H01L 21/3065* (2006.01)
*H01L 21/28* (2006.01)

(52) U.S. Cl.
CPC ........ *H01L 21/84* (2013.01); *H01L 21/28017* (2013.01); *H01L 21/3065* (2013.01); *H01L 27/1203* (2013.01)

(58) Field of Classification Search
CPC ..... H01L 21/28; H01L 21/28; H01L 21/2801; H01L 21/28017; H01L 21/30; H01L 21/306; H01L 21/3065; H01L 21/84; H01L 27/12; H01L 27/12; H01L 27/1203
USPC ........................................................ 257/347
See application file for complete search history.

(56) References Cited

U.S. PATENT DOCUMENTS

| | | | |
|---|---|---|---|
| 6,387,739 B1 | 5/2002 | Smith, III | |
| 6,624,459 B1 | 9/2003 | Dachtera et al. | |
| 6,635,518 B2 | 10/2003 | Aipperspach et al. | |
| 7,102,204 B2 * | 9/2006 | Berndlmaier | H01L 21/84 257/296 |
| 8,680,617 B2 | 3/2014 | Li et al. | |
| 2002/0020877 A1 | 2/2002 | Mandelman et al. | |
| 2010/0019320 A1 | 1/2010 | Fechner et al. | |

OTHER PUBLICATIONS

EE Times, Intel, IBM Dueling 14nm FinFETS, Oct. 21, 2014; http://www.eetimes.com/document.asp?doc_id=1324343.

* cited by examiner

*Primary Examiner* — Monica D Harrison
(74) *Attorney, Agent, or Firm* — Thompson Hine LLP

(57) ABSTRACT

Structures for a commonly-bodied field-effect transistors and methods of forming such structures. The structure includes a body of semiconductor material defined by a trench isolation region in a semiconductor substrate. The body includes a plurality of first sections, a plurality of second sections, and a third section, the second sections coupling the first sections and the third section. The third section includes a contact region used as a common-body contact for at least the first sections. The first sections and the third section have a first height and the second sections have a second height that is less than the first height.

19 Claims, 8 Drawing Sheets

COMMONLY-BODIED FIELD-EFFECT TRANSISTORS

BACKGROUND

The invention relates generally to integrated circuits and, in particular, to structures for field-effect transistors and methods of forming such structures.

Complementary metal-oxide-semiconductor (CMOS) technology finds use in, among other applications, radiofrequency (RF) circuits and high speed digital circuits. Generally, CMOS technology relies on complementary and symmetrical pairs of p-type and n-type field-effect transistors (nFETs and pFETS) to implement logic functions. Field-effect transistors include an active semiconductor region, a source and a drain defined in the active semiconductor region, and a gate electrode. When a control voltage exceeding a characteristic threshold voltage is applied to the gate electrode, an inversion or depletion layer is formed in a channel defined in the active semiconductor region between the source and drain by the resultant electric field and carrier flow occurs between the source and drain to produce a device output current.

Semiconductor-on-insulator (SOI) substrates may be advantageous in CMOS technology. In comparison with field-effect transistors built using a bulk silicon wafer, a semiconductor-on-insulator substrate permits operation at significantly higher speeds with improved electrical isolation and reduced electrical losses. Contingent on the thickness of the device layer of the SOI substrate, a field-effect transistor may operate in a partially-depleted mode in which the depletion layer in the channel in the device layer does not extend fully to the buried oxide layer when typical control voltages are applied to the gate electrode.

Partially-depleted SOI field-effect transistors may be fabricated with two types, namely floating-body SOI field-effect transistors (FBFET) or body contacted SOI field-effect transistors (BCFET). A FBFET conserves device area due to its comparatively small size, but suffers from the floating body effect due to the absence of a body contact. A BCFET may be unstable during operation, especially when operating in an RF circuit or a high speed digital circuit, because the threshold voltage is a function of a fluctuating body voltage. A BCFET includes a body contact that may eliminate body effects. However, BCFET covers more chip area than a FBFET, which reduces the density of a circuit built using BCFETs in comparison with a circuit built using FBFETs.

Improved structures for field-effect transistors and methods of forming such structures are needed.

SUMMARY

In an embodiment of the invention, a structure includes a body of semiconductor material defined by a trench isolation region in a semiconductor substrate. The body includes a plurality of first sections, a plurality of second sections, and a third section, the second sections coupling the first sections and the third section. The third section includes a contact region used as a common-body contact for at least the first sections. The first sections and the third section have a first height and the second sections have a second height that is less than the first height.

In an embodiment of the invention, a method is provided that includes forming a body of semiconductor material defined by a trench isolation region in a semiconductor substrate. The body includes a plurality of first sections, a plurality of second sections, and a third section, the second sections coupling the first sections and the third section. The third section includes a contact region used as a common-body contact for at least the first sections. The first sections and the third section have a first height and the second sections have a second height that is less than the first height.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
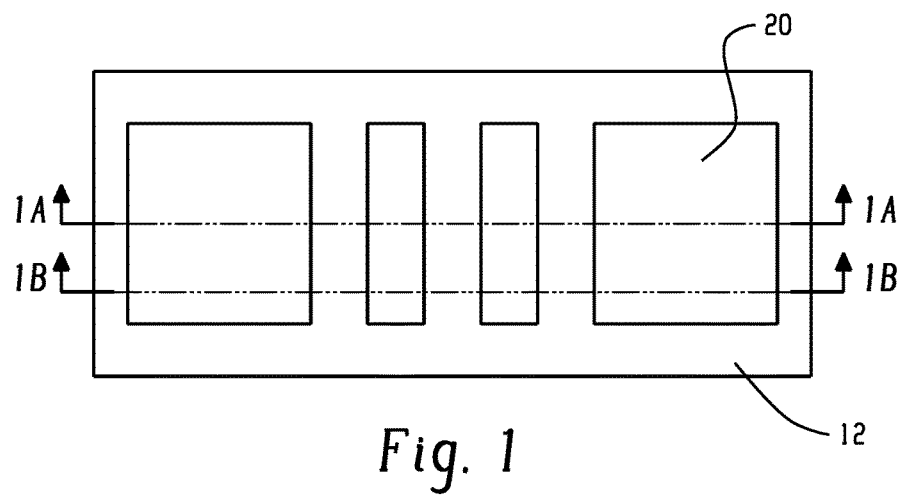
FIG. 1 is a top view of a portion of a substrate at an initial stage of a fabrication process forming a device structure in accordance with an embodiment of the invention.
Figure 1A:
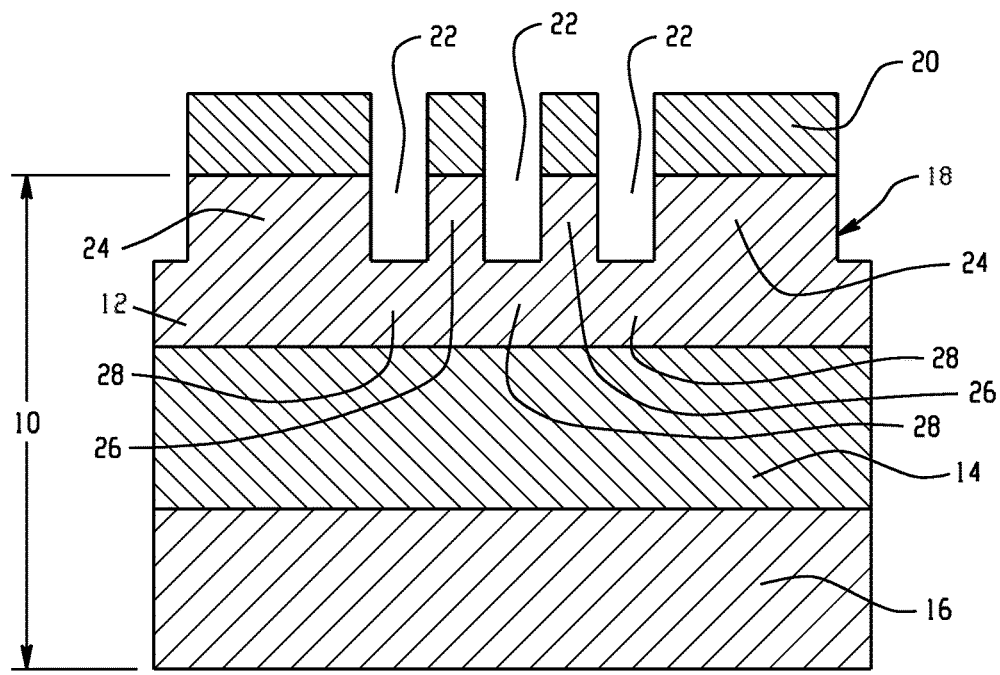
FIG. 1A is a cross sectional view taken generally along line 1A-1A in FIG. 1.
Figure 1B:
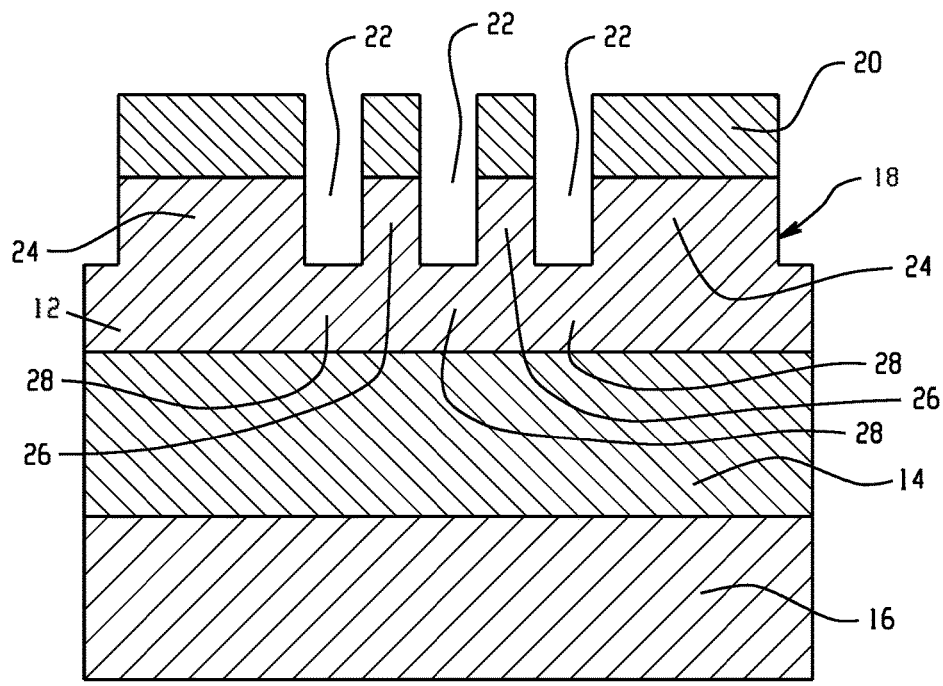
FIG. 1B is a cross sectional view taken generally along line 1B-1B in FIG. 1.

With reference to FIGS. 1, 1A, 1B and in accordance with an embodiment of the invention, a multi-stage etching process is employed to pattern a device layer 12 of a semiconductor-on-insulator (SOI) substrate 10 to form a semiconductor body 18. The SOI substrate 10 further includes a buried dielectric layer in the form of a buried oxide (BOX) layer 14 comprised of an oxide of silicon (e.g., $SiO_2$) and a handle wafer 16. The device layer 12 is separated from the handle wafer 16 by the intervening BOX layer 14 and is considerably thinner than the handle wafer 16. The device layer 12 and the handle wafer 16 may be comprised of a single crystal semiconductor material, such as single crystal silicon. The BOX layer 14 has a surface in direct contact with the handle wafer 16 along an interface and another surface in direct contact with the device layer 12 along an interface, and these surfaces are separated by the thickness of the BOX layer 14 extending to the rim of the SOI substrate 10. The device layer 12 is electrically isolated from the handle wafer 16 by the BOX layer 14.

In an initial stage of the process forming the multiple-depth trenches, an etch mask 20 is applied and used to form trenches 22 in the device layer 12 that extend from the top surface of the device layer 12 partially through the device layer 12 to a first depth. The etch mask 20 may be comprised of a layer of a light-sensitive material, such as an organic photoresist, that may be applied as a fluid by a spin coating process, pre-baked, exposed to light projected through a photomask, baked after exposure, and developed with a chemical developer to form the trenches 22. The etching process relies on an etch chemistry that removes the material of the device layer 12 and that is timed to end before penetrating through the device layer 12 to the BOX layer 14. The etch mask 20 may be subsequently removed. If comprised of a photoresist, the etch mask 20 may be removed by ashing or chemical stripping, followed by a cleaning process.

Following the etching process, the semiconductor body 18 includes multiple sections 24 and multiple sections 26 that are narrower in width than the sections 24. Sections 24, 26, which are masked during the etching process, possess the full thickness of the device layer 12. The field of the device layer 12 surrounding the sections 24, 26 and regions of the device layer between the sections 24, 26 are partially etched to a height that is a fraction of the initial thickness of the device layer 12, while the thicknesses of sections 24, 26 have a height that is equal to the initial thickness of the device layer 12. The sections 24 are wider than the sections 26.

Figure 2:
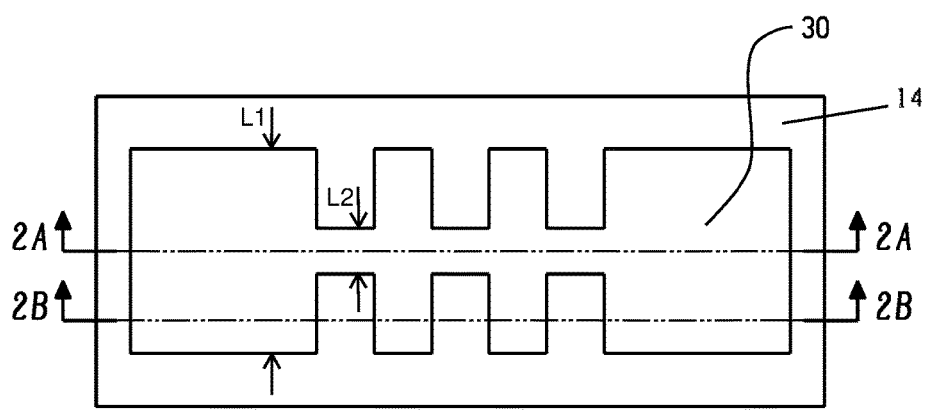
FIG. 2 is a top view of the substrate portion at a stage of a fabrication process subsequent to FIG. 1.
Figure 2A:
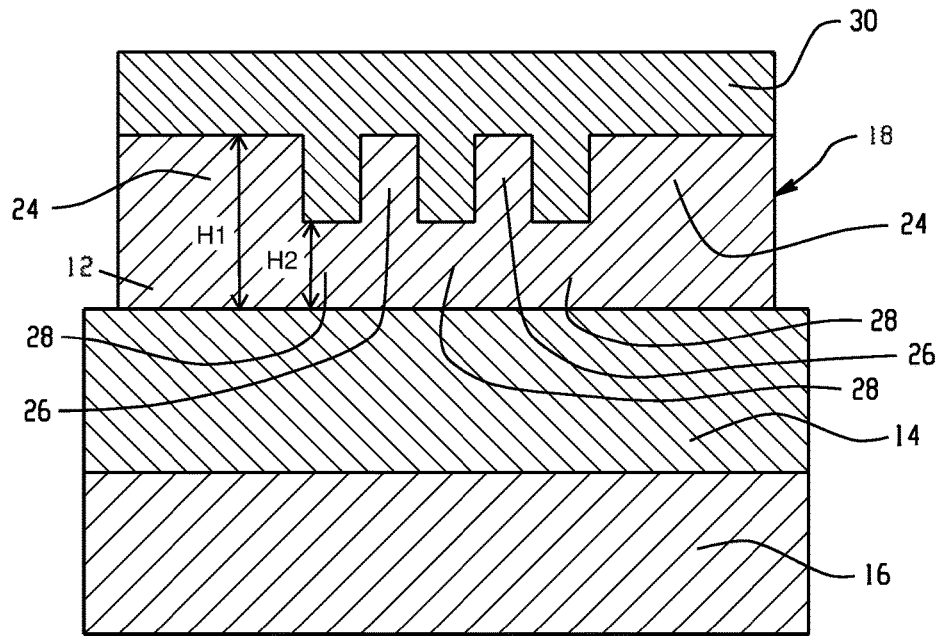
FIG. 2A is a cross sectional view taken generally along line 2A-2A in FIG. 2.
Figure 2B:
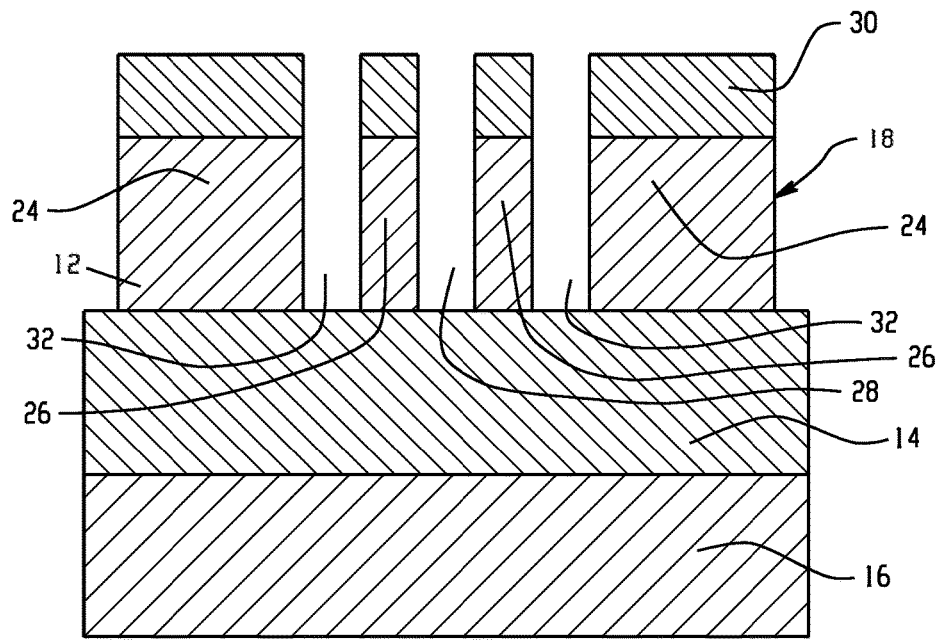
FIG. 2B is a cross sectional view taken generally along line 2B-2B in FIG. 2.

With specific reference to FIGS. 2, 2A, 2B in which like reference numerals refer to like features in FIGS. 1, 1A, 1B and at a subsequent fabrication stage, an etch mask 30 is applied and another etching process used to selectively extend the depth of trenches 22 to form trenches 32 in the device layer 12 that extend from the top surface of the device layer 12 completely through the device layer 12 to the BOX layer 14. Similar to etch mask 20, the etch mask 30 may be comprised of a layer of a light-sensitive material, such as an organic photoresist, that may be applied as a fluid by a spin coating process, pre-baked, exposed to light projected through a photomask, baked after exposure, and developed with a chemical developer to form the trenches 32. Etch mask 30 is similar to etch mask 20 in that the sections 24 and sections 26 are covered, but differs in that the sections 28 are only partially covered and exposed at their opposite ends. Sections 24, 26, which are masked during both stages of the etching process, remain intact and retain the full thickness of the device layer 12. The covered portions of sections 28 retain the partial thickness of the device layer 12. The field of the device layer 12 surrounding the sections 24, 26, 28 is etched and removed so that the trenches 32 extend about the entire circumference of the semiconductor body 18. The etching process may rely on an etch chemistry that removes the material of the device layer 12 selective to the material of the BOX layer 14 such that the etch stops on the BOX layer 14. The etch mask 30 may be subsequently removed. If comprised of a photoresist, the etch mask 30 may be removed by ashing or chemical stripping, followed by a cleaning process.

Sections 28 of the semiconductor body 18 are located between adjacent pairs of the sections 24, 26. The sections 28 have a different thickness than the sections 24, 26. Specifically, the heights or thicknesses, H1, of the sections 24, 26 are equal to the initial thickness of the device layer 12, and the heights or thicknesses, H2, of the sections 28 is a fraction of the thickness of the device layer 12 as established by the preceding etching process. Stated differently, the sections 24, 26 have a full height, and the sections 28 are shorter or less than the full height of sections 24, 26. The respective heights may be measured relative to the interface between the device layer 12 and the BOX layer 14 occurring at a top surface of the BOX layer 14 and a bottom surface of the device layer 12. As a consequence of the different heights, the sections 28 have respective top surfaces that are recessed relative to the respective top surfaces of the sections 24, 26. The sections 24 have the same length, L1, as the sections 26, and the lengths, L2, of the sections 28 are less than the lengths of the sections 24, 26. The sections 24, 26, 28 have respective widths in the plane of the lengths that are transverse to their lengths. The sections 28 may be centered in position relative to the lengths of the sections 24, 26.

The sections 28 provide respective physical links or connections between sections 24 and sections 26 of the semiconductor body 18. In particular, adjacent sections 26 are connected or coupled together by one of the sections 28, and the sections 24 are coupled with the nearest section 26 by one of the sections 28. In the representative embodiment, one of the sections 28 is used to connect adjacent sections 26 and one of the sections 28 is used to connect each section 24 with the adjacent section 26. During operation, the sections 28 couple the sections 24 and sections 26 to permit the application of an electrical bias to the semiconductor body 18.

The sections 26 may be further processed to form field-effect transistors and portions of the sections 24 may be further processed to form field-effect transistors. The number of processed sections 24, 26 represents the number of field-effect transistors sharing the semiconductor body 18, and is not limited in number to that depicted in the representative embodiment.

Figure 3:
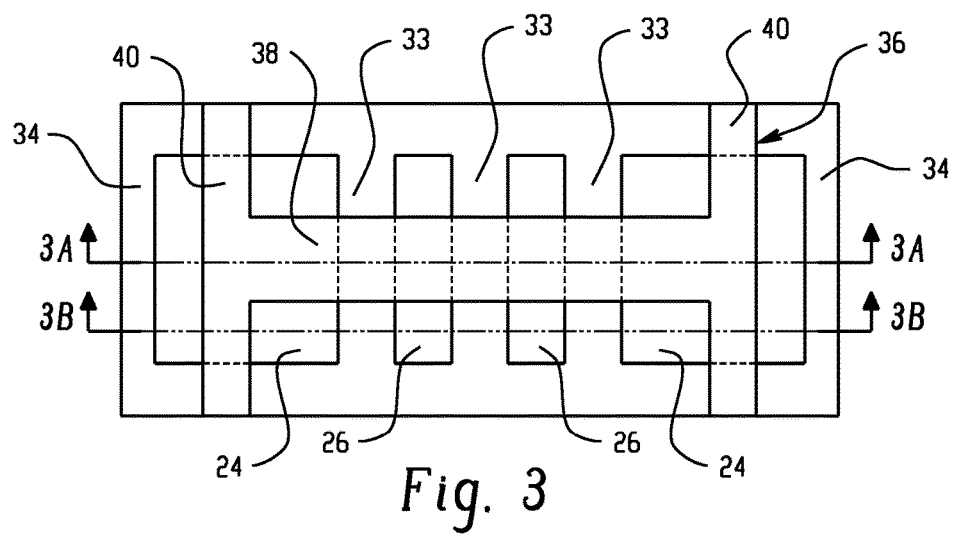
FIG. 3 is a top view of the substrate portion at a stage of a fabrication process subsequent to FIG. 2.
Figure 3A:
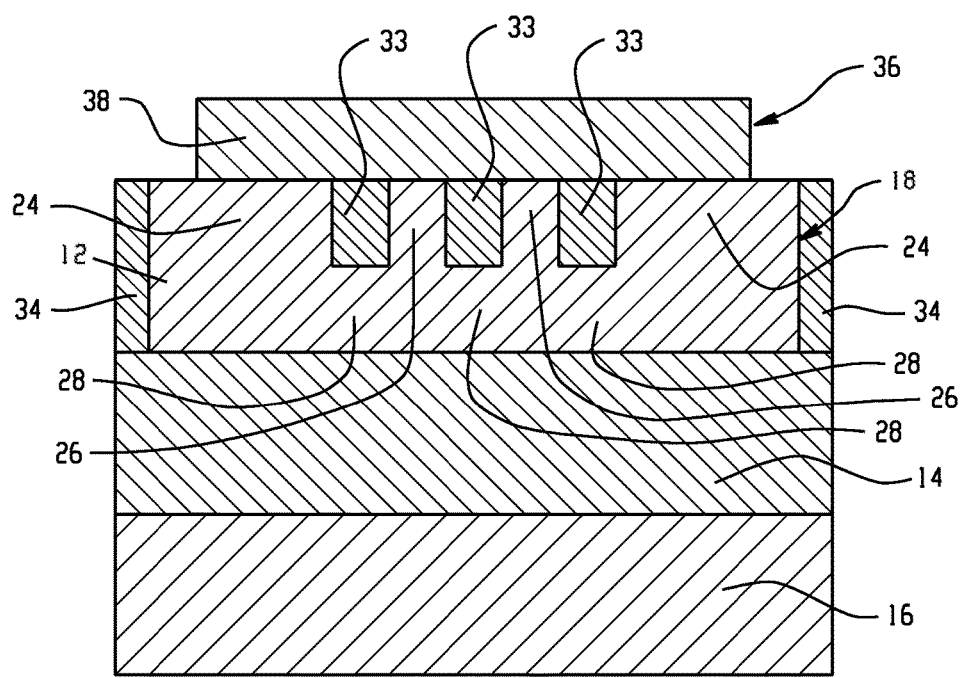
FIG. 3A is a cross sectional view taken generally along line 3A-3A in FIG. 3.
Figure 3B:
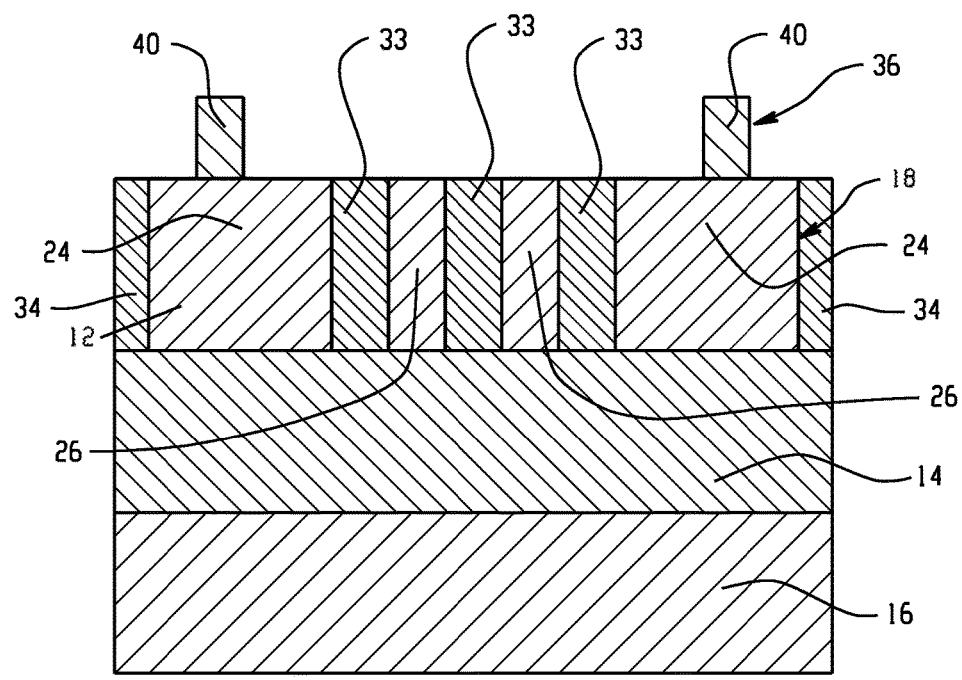
FIG. 3B is a cross sectional view taken generally along line 3B-3B in FIG. 3.

With specific reference to FIGS. 3, 3A, 3B in which like reference numerals refer to like features in FIGS. 2, 2A, 2B and at a subsequent fabrication stage, a trench isolation region 34 is formed by depositing an electrical insulator to fill the trenches 22, 32, and then planarizing the electrical insulator relative to the top surface of the device layer 12 using, for example, chemical mechanical polishing. The electrical insulator comprising the trench isolation region 34 may be silicon oxide (e.g., silicon dioxide) deposited by chemical vapor deposition. In an embodiment, the electrical insulator comprising the trench isolation region 34 may be a high-aspect-ratio process (HARP) oxide film deposited by sub-atmospheric chemical vapor deposition utilizing ozone and tetraethylorthosilicate (TEOS) as reactant gases.

The trench isolation region 34 includes fingers 33 that are located between the adjacent sections 24, 26 of the semiconductor body 18 and that cover the sections 28 of the semiconductor body 18. At the location of the sections 28, the fingers 33 are thinner and shallower than at other locations between the adjacent sections 24, 26. The composite thickness of the sections 28 and the fingers 33 at the location of the sections 28 is equal to the thickness of the sections 24, 26 and to the full thickness of the trench isolation region 34.

A gate structure 36 is formed on the semiconductor body 18. The gate structure 36 includes a central section 38 that extends transversely across a central portion of each of the sections 26, and that also overlies the sections 28. The T-shaped gate structure 36 includes end sections 40 that are disposed on the sections 24 and that may be subsequently used to contact the gate structure 36.

The gate structure 36 includes a gate electrode and a gate dielectric located between the gate electrode and the semiconductor body 18. The gate electrode of the gate structure 36 may be comprised of a metal, a silicide, polycrystalline silicon (polysilicon), or combinations of these materials, deposited by physical vapor deposition (PVD), chemical vapor deposition, etc. The gate dielectric of the gate structure 36 may be comprised of a dielectric or insulating material, such as silicon dioxide, silicon oxynitride, a high-k dielectric material such as hafnium oxide or hafnium oxynitride, or layered combinations of these dielectric materials, deposited by chemical vapor deposition, atomic layer deposition (ALD), etc. The gate dielectric and gate electrode of the gate structure 36 may be formed by patterning a layer stack of their constituent materials using photolithography and etching processes. Non-conductive spacers (not shown) may be formed on the sidewalls of the gate structure 36.

Figure 4:
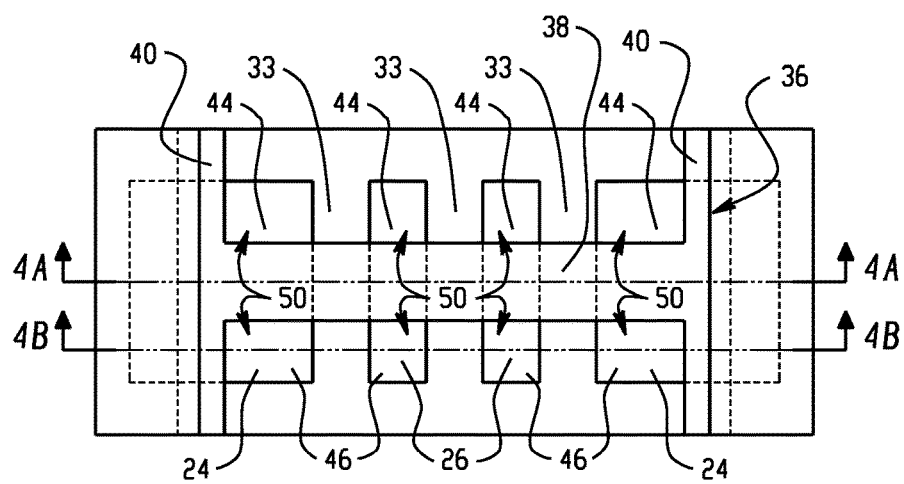
FIG. 4 is a top view of the substrate portion at a stage of a fabrication process subsequent to FIG. 3.
Figure 4A:
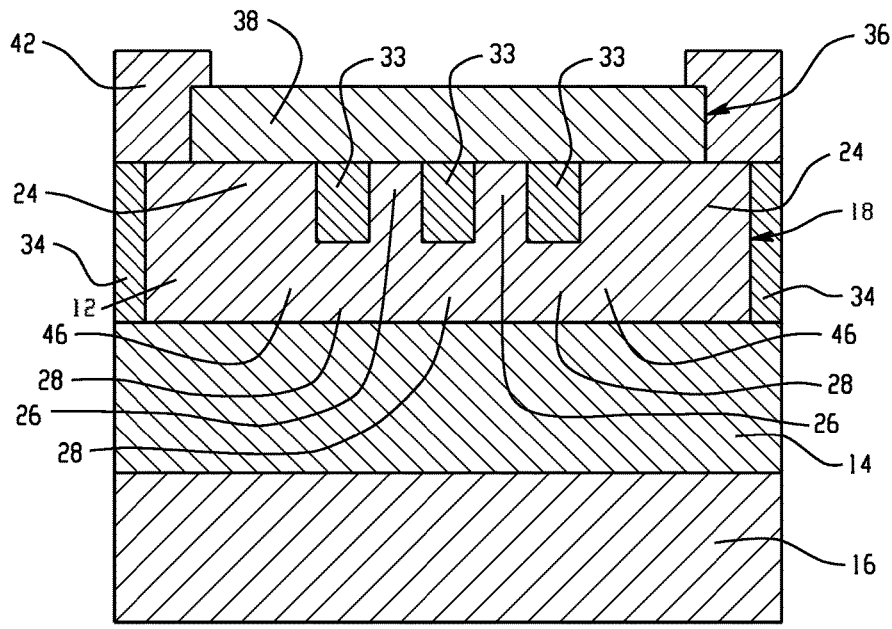
FIG. 4A is a cross sectional view taken generally along line 4A-4A in FIG. 4.
Figure 4B:
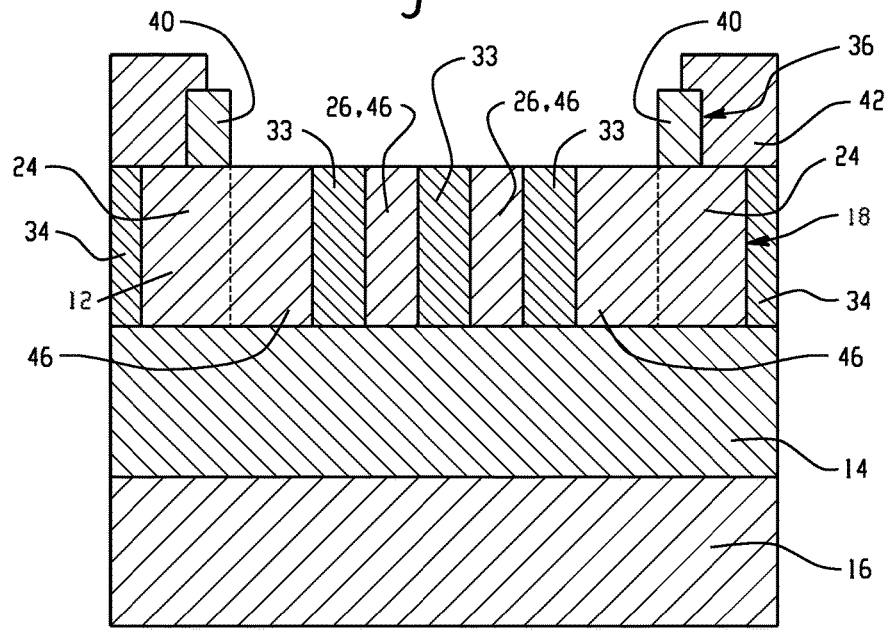
FIG. 4B is a cross sectional view taken generally along line 4B-4B in FIG. 4.

With reference to FIGS. 4, 4A, 4B in which like reference numerals refer to like features in FIGS. 3, 3A, 3B and at a subsequent fabrication stage, a block mask 42 is applied that partially covers the sections 26 of the semiconductor body 18. A dopant is introduced into the ends of the sections 26 that are not covered by the gate structure 36 and into the ends of the sections 24 that are not covered by the gate structure 36 and the block mask 42 to define source/drain regions 44, 46 of field-effect transistors 50, which share the gate structure 36. As used herein, the term "source/drain region" means a doped region of semiconductor material that can function as either a source or a drain of a field-effect transistor. The gate structure 36 and the block mask 42 collectively determine which portions of the semiconductor body 18 receive the dopant forming the source/drain regions 44, 46 and which portions of the semiconductor body 18 do not receive the dopant forming the source/drain regions 44, 46. The latter portions define channels of the field-effect transistors 50. The semiconductor material of the source/drain regions 44, 46 may comprise an n-type dopant from Group V of the Periodic Table (e.g., phosphorus (P) or arsenic (As)) that is effective to impart n-type conductivity, and may be introduced by ion implantation. The implantation conditions (e.g., ion species, dose, kinetic energy) are selected to provide a desired concentration profile. The ions introducing the n-type dopant are stopped within the thickness of the block mask 42.

Figure 5:
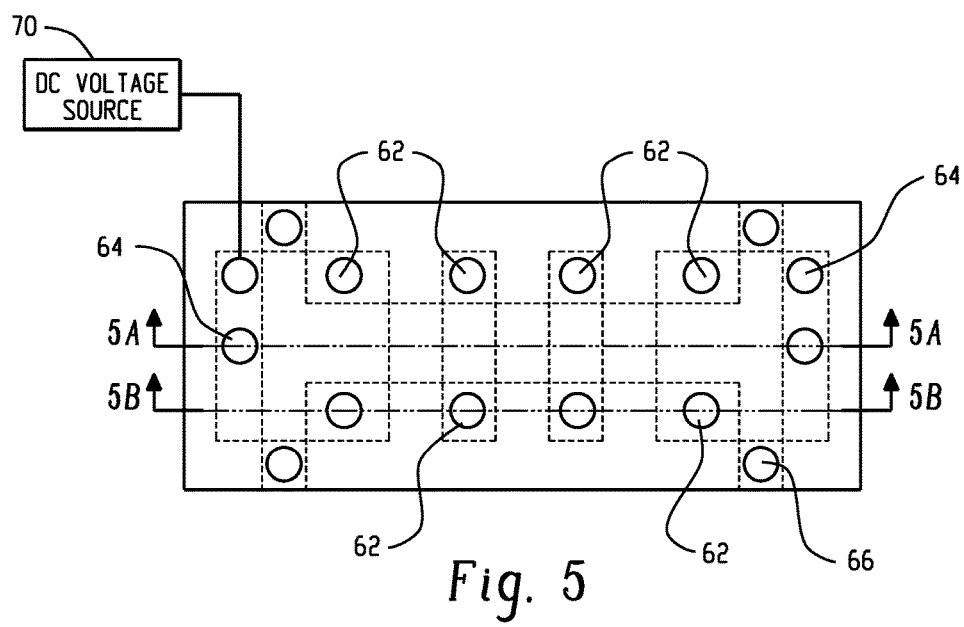
FIG. 5 is a top view of the substrate portion at a stage of a fabrication process subsequent to FIG. 2.
Figure 5A:
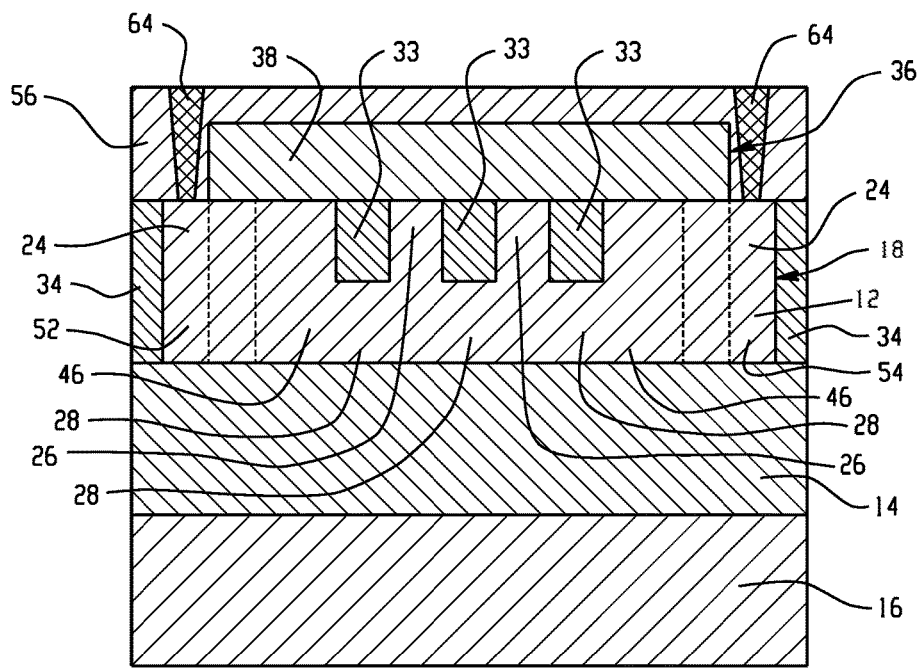
FIG. 5A is a cross sectional view taken generally along line 5A-5A in FIG. 5.
Figure 5B:
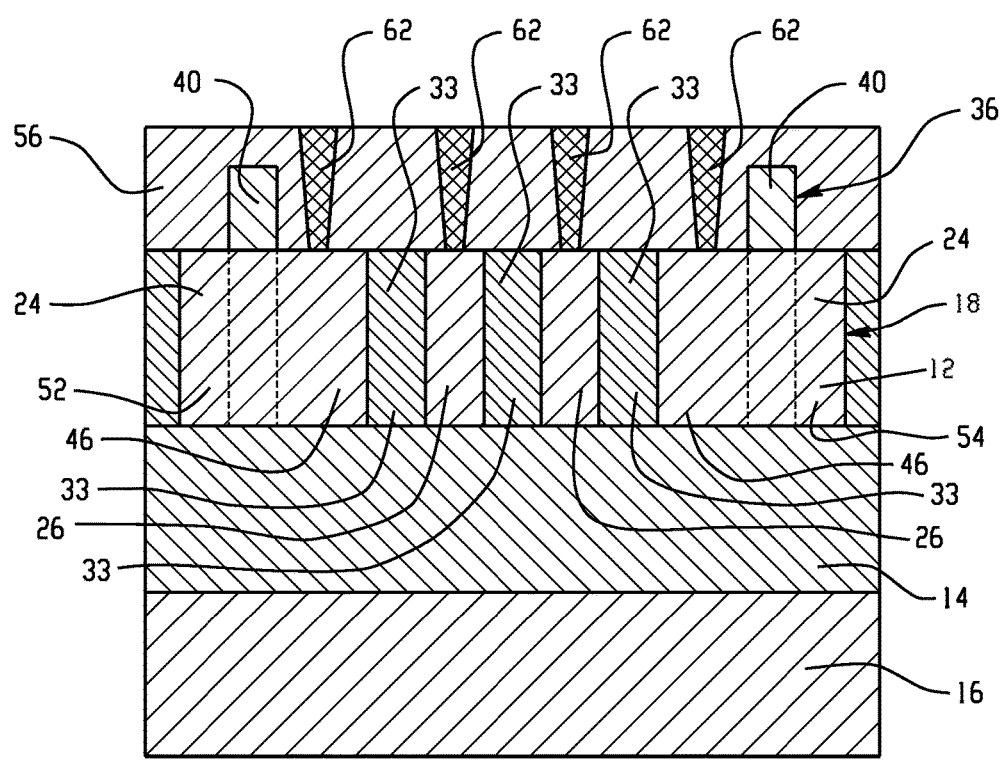
FIG. 5B is a cross sectional view taken generally along line 5B-5B in FIG. 5.

With reference to FIGS. 5, 5A, 5B in which like reference numerals refer to like features in FIGS. 4, 4A, 4B and at a subsequent fabrication stage, a block mask (not shown) is applied that covers the entire semiconductor body 18 other than the peripheral ends of the sections 24. A dopant is introduced into the exposed portions of the sections 24 to define common-body contact regions 52, 54 that are used to contact the body 18. The gate structure 36 and the block mask 51 collectively determine which portions of the semiconductor body 18 receive the dopant. The semiconductor material of the common-body contact regions 52, 54 may comprise a p-type dopant selected from Group III of the Periodic Table (e.g., boron (B)) that is effective to impart p-type conductivity, and may be introduced by ion implantation. The implantation conditions (e.g., ion species, dose, kinetic energy) are selected to provide a desired concentration profile. The ions introducing the p-type dopant are stopped within the thickness of the block mask. In an alternative embodiment, the common-body contact regions 52, 54 may receive an n-type dopant and the source/drain regions 44, 46 may receive a p-type dopant to impart the opposite conductivity types to the respective semiconductor materials.

The field-effect transistors 50 are commonly bodied due in part to the connecting sections 28 that couple the sections 24, 26 together so that semiconductor material of the body 18 is shared and the common-body contact regions 52, 54 are coupled with all of the field-effect transistors 50. Crosstalk between the field-effect transistors 50 is prevented because of the shorter height of the connecting sections 28 relative to the BOX layer than the sections 24, 26 and, generally, because the partial-depletion in the respective channels of the field-effect transistors 50 during device operation does not extend to the depth of the section 28. As a result, the threshold voltages applied to operate the field-effect transistors is insufficient to permit carrier flow in the connecting sections 28 between the different sections 24, 26. For example, the threshold voltage for the field-effect transistors may be in a range of 0.3 volts to 0.5 volts, while the threshold voltage to permit carrier flow through the connecting sections 28 may be in excess of 10 volts. However, the connecting sections 28 do permit the application of a body voltage used to stabilize device operation.

Similar to a BCFET, the body voltage can be regulated to eliminate fluctuations of the threshold voltage, which eliminates body effects and improves device stability. The shared body of the field-effect transistors 50 can be conveniently contacted using the common-body contact regions 52, 54 at the opposite ends of the shared body 18. The device structure conserves device area, like a FBFET, because the semiconductor body 19 includes multiple field-effect transistors 50 and common-body contact regions 52, 54 shared by the field-effect transistors 50. This may improve device stability when operating, for example, in an RF circuit or a high speed digital circuit.

Standard silicidation, middle-of-line (MOL) processing, and back-end-of-line (BEOL) processing follows, which includes formation of contacts and wiring for the local interconnect structure overlying the field-effect transistors, and formation of dielectric layers, via plugs, and wiring for an interconnect structure coupled by the interconnect wiring with the field-effect transistors, as well as other similar contacts for additional device structures fabricated on the substrate 10.

Sections of a silicide layer are formed on the gate structure 36, the source/drain regions 44, 46, and the common-body contact regions 52, 54. The silicide layer may be formed by a silicidation process that involves one or more annealing steps to form a silicide phase by reacting a layer of silicide-forming metal and the semiconductor material contacting the silicide-forming metal. Candidate materials for the silicide-forming metal include, but are not limited to, refractory metals such as titanium (Ti), cobalt (Co), or nickel (Ni).

A local interconnect structure, which is formed by middle-end-of-line processing, includes a dielectric layer 56, contacts 60, 62, 64, and wiring. Candidate inorganic dielectric materials for the dielectric layer 56 may include, but are not limited to, silicon dioxide ($SiO_2$), silicon nitride ($Si_3N_4$), and combinations of these and other dielectric materials. Dielectric layer 56 may be deposited by any number of techniques, such as sputtering, spin-on application, or chemical vapor deposition, and then planarized by chemical mechanical polishing. Contacts 60 extend through the dielectric layer 56 to contact the silicide layer on the gate structure 36. Contacts 62 extend through the dielectric layer 56 to contact the silicide layer on the source/drain regions 44, 46. Common-body contacts 64 extend through the dielectric layer 56 to contact the silicide layer on the common-body contact regions 52, 54. A DC voltage source 70 may be coupled with the common-body contacts 64, and used to control the body voltage when powered.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a body of semiconductor material defined by a trench isolation region in a semiconductor substrate, the body including a plurality of first sections, a plurality of second sections, and a third section, the second sections coupling the first sections and the third section, and the third section including a contact region used as a common-body contact for at least the first sections,
wherein the first sections and the third section have a first height and the second sections have a second height that is less than the first height, the semiconductor substrate is a silicon-on-insulator substrate that includes a device layer and a buried oxide layer, and the first sections, the second sections, and the third section comprise portions of the device layer.

2. The structure of claim 1 wherein the trench isolation region is comprised of an insulator that is co-planar with the semiconductor material of the first sections and the third section.

3. The structure of claim 1 wherein each of the first sections is associated with one of a corresponding plurality of field-effect transistors.

4. The structure of claim 3 wherein each of the first sections includes a source and a drain of the respective field-effect transistor.

5. The structure of claim 4 further comprising:
a gate structure having a portion extending across the first sections between the source and the drain of each first section.

6. The structure of claim 1 wherein the third section and each of the first sections are associated with one of a corresponding plurality of field-effect transistors.

7. The structure of claim 1 wherein the first sections are arranged as adjacent pairs, each adjacent pair of the first sections is connected by one of the second sections, and the third section is connected to one of the first sections by one of the second sections.

8. The structure of claim 7 wherein the first sections have a first length and a first width, the second sections have a second length and a second length, and the second length is less than the first length.

9. The structure of claim 8 wherein the second sections are centrally located relative to the first length of the first sections.

10. The structure of claim 1 wherein the trench isolation region includes a plurality of fingers located between the first sections and the third section, and each of the second sections is vertically located between one of the fingers and the buried oxide layer.

11. The structure of claim 1 wherein the first height is equal to a thickness of the device layer and the second height that is less than the thickness of the device layer.

12. The structure of claim 1 further comprising:
a fourth section including a contact region used as another common-body contact for at least the first sections,
wherein the first sections and the second sections are laterally arranged between the third section and the fourth section.

13. The structure of claim 1 further comprising:
a voltage source; and
one or more common-body contacts coupling the voltage source with the common-body contact region of the third section.

14. A method comprising:
forming a body of semiconductor material defined by a trench isolation region in a semiconductor substrate, the body including a plurality of first sections, a plurality of second sections, and a third section, the second sections coupling the first sections and the third section, and the third section including a contact region used as a common-body contact for at least the first sections,
wherein the first sections and the third section have a first height and the second sections have a second height that is less than the first height, the semiconductor substrate is a silicon-on-insulator substrate that includes a device layer and a buried oxide layer, and the first sections, the second sections, and the third section comprise respective portions of the device layer.

15. The method of claim 14 wherein forming the body of semiconductor material defined by the trench isolation region in the semiconductor substrate comprises:
applying a first mask that covers the first sections, the second sections, and the third section; and
after the first mask is applied, etching the semiconductor material to form trenches that extend to a first depth into the semiconductor substrate.

16. The method of claim 15 further comprising:
applying a second mask that covers the first sections, the third section, and a central region of each of the second sections; and
after the second mask is applied, etching the semiconductor material to deepen the trenches to a second depth into the semiconductor substrate,
wherein the trenches retain the first depth at the location of the central region of each of the third sections, and the second depth is greater than the first depth.

17. The method of claim 16 wherein the trenches extend at the second depth to the buried oxide layer.

18. The method of claim 16 further comprising:
filling the trenches with an insulator,
wherein the insulator covers each of the second sections.

19. The method of claim 14 wherein the trench isolation region is comprised of an insulator that is co-planar with the semiconductor material of the first sections and the third section.

* * * * *